US005389863A

United States Patent [19]

Flückiger

[11] Patent Number: 5,389,863

[45] Date of Patent: Feb. 14, 1995

[54] ROTOR MOVEMENT SENSING SYSTEM

[75] Inventor: Daniel Flückiger, Walkringen, Switzerland

[73] Assignee: Ascom Autelca AG, Berne, Switzerland

[21] Appl. No.: 14,658

[22] Filed: Feb. 8, 1993

[51] Int. Cl.[6] .................... G06M 3/12; G07B 17/00; H03K 21/40

[52] U.S. Cl. .................................... 318/549; 377/28; 377/32; 235/47

[58] Field of Search ............... 318/565, 567, 609, 626, 318/628, 652, 653, 671, 3, 490, 549, 550, 557, 563, 672, 673; 101/45, 91; 377/13, 27, 28, 30, 32; 235/33, 47, 144 R, 144 ME, 144 E

[56] References Cited

U.S. PATENT DOCUMENTS 4,016,467 4/1977 Hallenbeck .......................... 318/604
4,253,015 2/1981 McFiggans et al. .
4,421,023 12/1983 Kittredge ............................ 101/45
4,774,881 10/1988 Schubert .............................. 101/91
4,864,505 9/1989 Miller et al. .................... 364/464.02

*Primary Examiner*—Bentsu Ro

*Attorney, Agent, or Firm*—Brumbaugh, Graves, Donohue & Raymond

[57] ABSTRACT

A rotor movement sensing system in a postage meter permits detection of the printing of postage even if power is lost during the printing cycle. A sensor senses a magnet on a disk when the rotor is substantially past its home position. A second sensor has a magnetic memory element. When the magnet on the disk passes near the memory element, that element is magnetized. A Hall-effect sensor at the memory element provides an interrupt to a processor to indicate magnetization of the memory element. A winding is provided around the memory element. The processor has an output which, when asserted, causes current flow through the winding, demagnetizing the memory element. Alternatively a reed switch senses rotor rotation, a flip-flop provides a bistable latch and its output provides a datum for the processor. An interrupt routine provides that during a routine franking cycle the processor responds to the interrupt, makes record in nonvolatile memory of the occurrence of the printing cycle, and energizes the winding or flip-flop reset. This interrupt routine is executed for each franking cycle when power is continuously available.

32 Claims, 8 Drawing Sheets

ROTOR MOVEMENT SENSING SYSTEM

BACKGROUND OF THE INVENTION

In any electronic postage meter it is important that the electronic registers faithfully reflect the actual mechanical printing of postage by the print rotor. In nearly all instances of the printing of postage, electric power is available for the entirety of the print cycle and the processor, which controls and monitors printing of postage, is able to decrement and increment the descending and ascending registers accordingly.

Most of the time, when the rotor is not in motion (because it is not printing postage) the rotor is in or very near to a "home" position. It is standard to have a sensor that indicates to the processor that the rotor is in the home position. A typical sensor arrangement is to place a permanent magnet on a disk attached to the rotor shaft. A Hall-effect sensor is positioned so that the sensor is "on" when the rotor is in its home position. If a print cycle is in progress, the processor can confirm the completion of the cycle by sensing the return of the rotor to the home position.

It is also standard to have a ratchet or other mechanical arrangement coupled to the rotor shaft so that the rotor cannot be moved very far backwards. However, a number of design constraints limit how tightly the ratchet performs its task. For example, at the end of a print cycle, it is not uncommon that the rotor may reach the home position (as expected) but may also go slightly past the home position due to rotational inertia or due to drag from a large item being franked. If the meter is to be satisfactory to the user, the ratchet must permit the slight reverse rotation back to the home position.

The design of the meter must necessarily take into account, however, the prospect that power may fail unexpectedly. The processor may thus be in the situation of not having quite enough information to distinguish whether or not a print cycle has occurred. For example, one of the indications to the processor that a print cycle has begun is the home sensor turning off. This indicates that the rotor has moved from the home position. But if power is lost after the home sensor has turned off, then later when the processor again has power the processor may find that the home sensor is again on. This could have happened, however, due to either of two mechanical sequences.

On the one hand, the rotor may indeed have printed a print cycle, finished while processor power was absent. This would result in the home sensor again being on.

On the other hand, the rotor might merely have moved slightly past the home position, and then dropped backwards again to the home position, all while processor power was absent. This, too, would result in the home sensor again being on. This slight forward-and-back movement could, as described above, arise due to a slight overrun of a previous print cycle.

The difficulty, however, is that without more information the processor is not capable of distinguishing which mechanical sequence actually occurred. There is the difficulty, then that the meter designer would not know whether or not to program the processor to increment and decrement the ascending and descending registers in the face of such sensor inputs. This presents the possible problem that the amount of postage actually printed may fail to correspond perfectly with the information in the descending and ascending registers.

One prior-art approach to this problem is that found in U.S. Pat. No. 4,253,015 to McFiggans et al. ("the '015 patent"). As described in FIGS. 1 and 3 of that patent, there is provided a counter gear 61 that is twice as large as a gear 60 on the rotor shaft; the counter gear 61 has an angular velocity at all times half that of the rotor (also called a "drum" in this patent). Depending on whether the rotor has finished an even-numbered or odd-numbered printing cycle, the counter gear 61 will be in one of two orientations. Two holes 62 and 63, located at different radii on the counter gear 61, will trigger one of two sensors 67 or 66 respectively, permitting the processor 120 to know whether the print cycle just finished was an odd-numbered one or an even-numbered one.

This approach has a number of drawbacks, chief among them that it requires a large counter gear which takes up space in the meter, which adds to the count of moving parts, and which adds to the inertial moment that must accelerate and decelerate with each print cycle. The approach degrades the mechanical reliability of the meter, adds to the parts and assembly cost, and adds to wear due to use.

It would thus be desirable to have a way of providing sensor information to the processor to resolve ambiguities regarding rotor movement during times when the processor has been unpowered, all without unduly degrading reliability and increasing parts and assembly cost.

SUMMARY OF THE INVENTION

In summary, the new rotor sensing concept employs changes to hardware and software of the meter.

In hardware, an additional sensor is provided to sense the magnet on the disk when the rotor is substantially past the home position. This additional sensor is positioned far enough past the home position that the above-mentioned ratchet will have ensured that the rotor must continue forward to completion of a print cycle. It would not, however, be workable simply to use a second Hall-effect sensor at this location, with the second sensor (like the home sensor) continuously monitored by the processor. The reason is that the time interval required for mechanical movement of the rotor to the second sensor would be long enough that power failure might render the processor incapable of detecting the output of the second sensor. To make the second sensor useful for its intended purpose, the second sensor is selected to be a so-called magnetic memory element ("MME") sensor. The MME sensor has a magnetic memory element with substantial magnetic hysteresis. When the disk magnet passes near the memory element, the memory element is magnetized. The magnetization of the memory element persists long after the permanent magnet of the disk has passed. A Hall-effect sensor is positioned at the memory element so that it provides a signal to the processor indicative of the magnetization of the memory element. Preferably the signal is provided to the processor both as a discrete (polled) input and also as an interrupt. A solenoidal winding is provided around the memory element. The processor has an output which, when asserted, causes a substantial current to flow through the winding, whereby the memory element is demagnetized.

In another embodiment of the invention, a reed switch is employed to sense movement of the rotor past a particular angular position. A flip-flop provides a bistable means backed up by a lithium cell or other reliable source of power, and the output of the flip-flop provides a datum for the processor.

Several changes are made in software to effectuate the new rotor sensing concept. An interrupt routine is provided responsive to the signal from the second sensor, so that during a routine franking cycle the processor responds to the interrupt, makes record in nonvolatile memory of the occurrence of the printing cycle, and energizes the winding. This interrupt routine is executed for each franking cycle when power is continuously available, which is the normal and expected situation.

Of course, the remaining situation to be provided for in software is the application of power to the processor under circumstances where there is reason to suspect that a print cycle took place during a power outage. The power-up routine of the software, then, has a step of noting whether the second sensor is on. If it is, then the processor assumes (and this assumption is one in which the designer has high confidence) that a printing cycle did take place. The processor then clears the memory element by energizing the winding, and makes record of the printing cycle in nonvolatile memory.

DESCRIPTION OF THE DRAWING

The invention will be described with respect to a drawing, of which.

DETAILED DESCRIPTION

Figure 10:
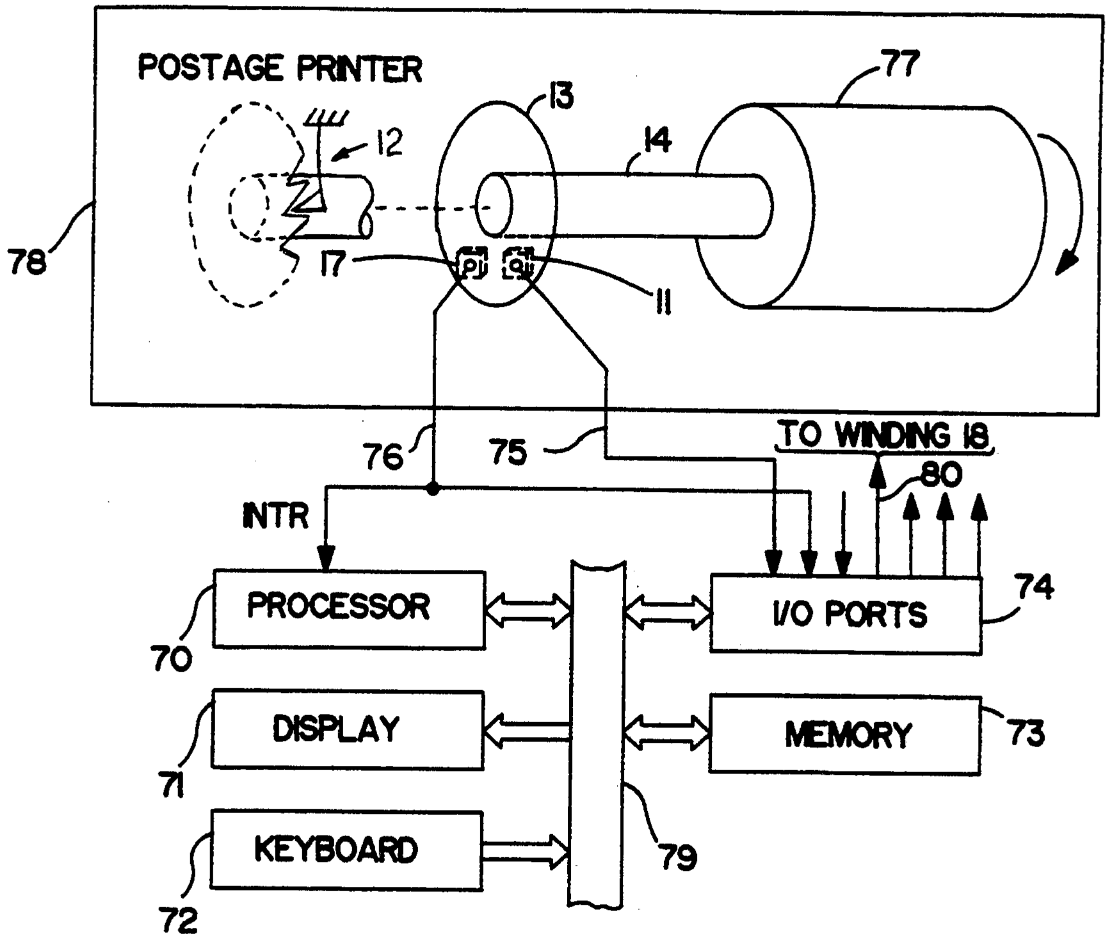
FIG. 10 is a diagrammatic illustration and shows an overall processor system configuration.

An overview of the postage meter in accordance with the invention is shown in FIG. 10. Processor 70 controls nearly all functions of the meter, responding to user inputs at keyboard 72 and providing information to the user at display 71. The processor 70 is operatively coupled to the keyboard and display by digital bus 79, which also provides operative coupling to memory 73, I/O ports 74, and other devices omitted for clarity from FIG. 10. Postage is printed by a rotation of print drum or rotor 77, which contains print wheels settable under processor control by setting means, not shown in FIG. 10 for clarity. Mechanical locking, also omitted for clarity from FIG. 10, is provided so that when the rotor 77 moves away from the home position the print wheels are locked into place. As a result, if a print cycle is found to have occurred during a time of loss of power, due to the locking there is little doubt about the position of the print wheels, and thus little doubt about the amount of postage that was printed. Ratchet means 12, shown diagrammatically in FIG. 10, limits the extent to which rotor 77 may be moved in a direction other than that shown. The rotor turns on shaft 14, which is held by journal and thrust bearings, not shown.

In FIG. 10, disk 13 may be seen, preferably positioned at the other end of shaft 14. Sensors 11 and 17 are disposed near the disk 13. Sensor 11, the "home" sensor about which more will be said below, gives a discrete input via line 75 to one of the input lines at the I/O ports 74. Sensor 17, the MME sensor about which more will be said below, gives a discrete input via line 76 to one of the input lines at the I/O ports 74, and also preferably provides an interrupt to the processor 70.

Figure 1:
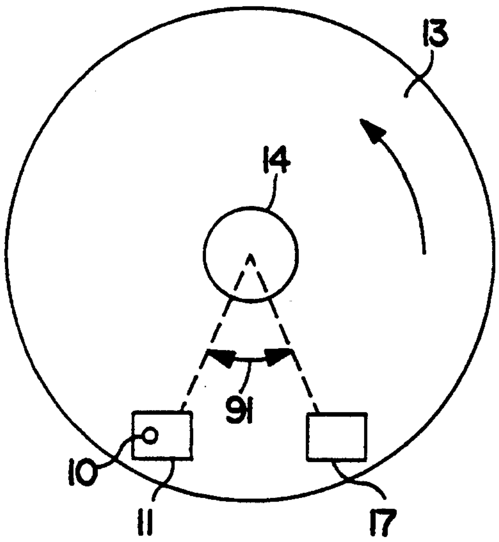
FIG. 1 is a diagrammatic plan view showing a rotor shaft, disk, and home and MME sensors.

Turning now to FIG. 1, the disk 13 is seen in plan from a point of view at the rotor 77 (not shown in FIG. 1). It will be appreciated that due to the change in point of view, the normal direction of rotation for disk 13 as shown in FIG. 1 is counterclockwise. Shaft 14 is shown in cross section. Hall-effect sensor 11 defines a "home" position on disk 13, and permanent magnet 10 is located on disk 13 proximate to sensor 11. A second sensor 17, the MME sensor, is positioned as shown.

Figure 2:
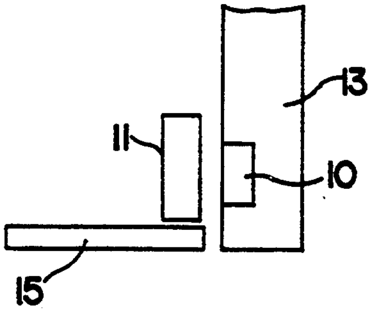
FIG. 2 is a fragmentary diagrammatic view of the assemblage of FIG. 1 and shows the home sensor.
Figure 3:
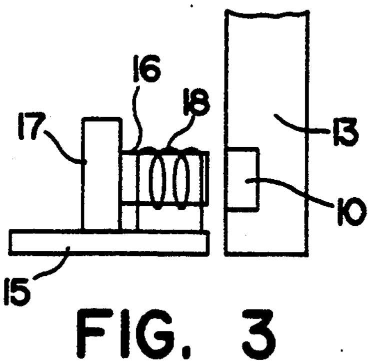
FIG. 3 is a further fragmentary diagrammatic view of the assemblage of FIG. 1 and shows the MME sensor.

FIG. 2 shows sensor 11 in a section taken through disk 13. Sensor 11, which as mentioned above is preferably a Hall-effect sensor, is preferably mounted to a printed circuit board 15 and, when the rotor is in the home position, permanent magnet 10 is quite nearby. FIG. 3 shows sensor 17 in a section parallel to but displaced from the section of FIG. 2. Sensor 17 is likewise preferably mounted to the same printed circuit board 15. In this figure disk 13 is shown having rotated so that magnet 10 is nearby to sensor 17; it will be appreciated that FIGS. 2 and 3 show things that do not happen simultaneously since magnet 10 cannot simultaneously be adjacent to both sensors 11 and 17.

The second sensor 17 differs from home sensor 11 not only in its location but also in provision of the magnetic memory element (MME) 16, which has substantial magnetic hysteresis. When the disk magnet 10 passes near the memory element 16, the memory element 16 is magnetized. The magnetization of the memory element 16 persists long after the permanent magnet 10 of the disk 13 has passed. The Hall-effect sensor 17 is positioned at the memory element 16 so that it provides a signal to the processor 70 (not shown in FIG. 3) indicative of the magnetization of the memory element 16. In FIG. 3 may also be seen a solenoidal winding 18 around the memory element 16. The processor 70 has an output 80 (shown in FIG. 10) which, when asserted, causes a substantial current to flow through the winding 18, whereby the memory element 16 is demagnetized.

It will be appreciated by those skilled in the art that design considerations may prompt any of a number of locations for the sensors 11, 17 and magnet 10. Cost is reduced if a circuit board 15 is already nearby, so that the sensors 11, 17 may be mounted directly to that circuit board 15, providing both mechanical mounting and electrical connections. This also prompts placing the sensors 11, 17 in a plane parallel to a main plane of the chassis of the meter, so that both may be placed on a single circuit board 15 rather than on two separate circuit boards. The elevation of the single circuit board 15 and the diameter of the disk 13 are chosen so as to make angle 91, shown in FIG. 1, as large as desired. Angle 91 is selected to satisfy a number of constraints including that the angle be great enough that the ratchet does not permit a backwards movement of the rotor 77 back to the home position.

Figure 4:
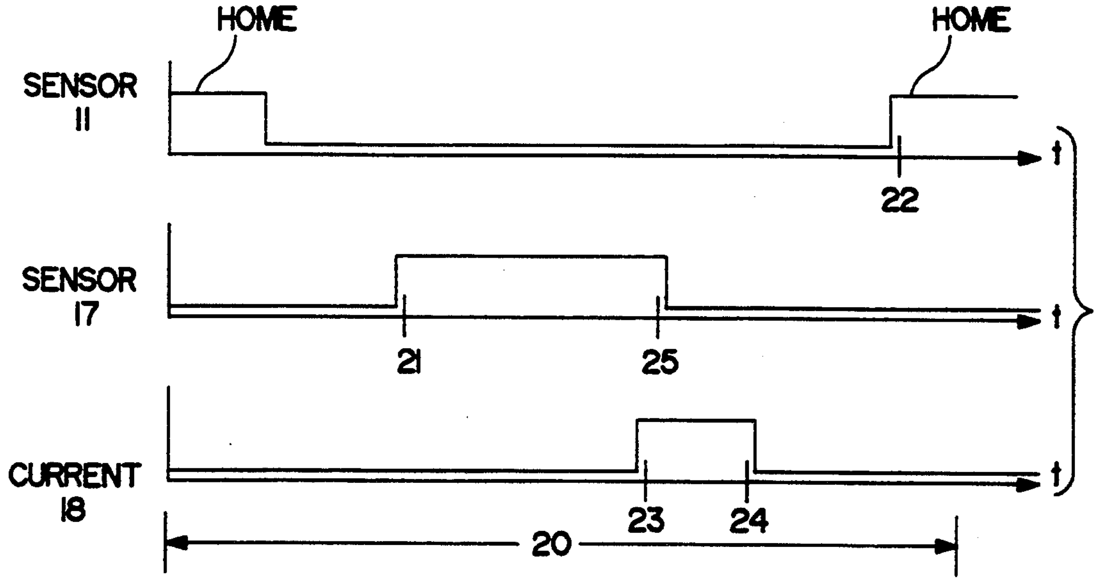
FIG. 4 is a timing diagram for signals to and from the sensors of FIGS. 1–3.

Turning now to FIG. 4, there is shown a timing diagram for various of the signals of the rotor sensing concept. The top line shows the output of sensor 11, which is high when the rotor begins in a home position, and is again high when the rotor has returned to a home position at 22. The duration of one complete print cycle is thus seen to correspond to interval 20. Those skilled in the art will appreciate that the high output of sensor 11 may persist for a long time if a long time passes between franking cycles, as will sometimes happen during the course of a day. Those skilled in the art will also appreciate that the rise and fall of the signal from sensor 11 do not coincide precisely with the rotor's being in the home position. Rather, to allow from some variation in the magnet, the Hall-effect sensor, and their geometric relationship, the system is set up so that the rise of the signal precedes the arrival of the rotor at the home position, and so that the fall of the signal follows the departure of the rotor from the home position.

The next line shows the output of the sensor 17. At 21, the output rises, which means the rotor has moved by approximately the angle 91 so as to bring magnet 10 nearby to sensor 17. In the normal course of events (that is, in the absence of loss of power) the processor 70 will receive an interrupt at time 21. Then, at time 23, processor 70 generates the current pulse to winding 18 (see FIG. 3) via line 80 (see FIG. 10). The interval between 21 and 23 is mostly a result of the latency time of the interrupt-handling routine of the processor. The pulse is held until time 24, which may be a fixed interval or may be an interval determined by the downgoing transition 25 as detected by the processor.

Figure 5:
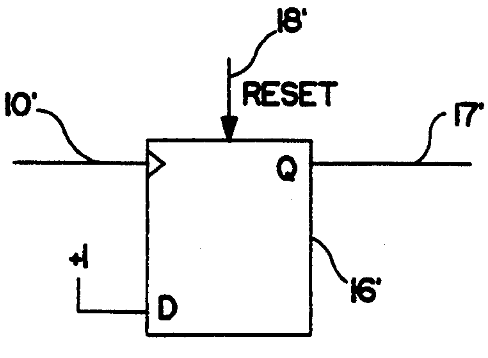
FIG. 5 is a diagrammatic illustration showing a symbolic equivalent for the MME sensor of FIGS. 1–3.

FIG. 5 shows in functional block form an equivalent circuit for the sensor shown in FIG. 3. The sensor is not, of course, a counter because it does not distinguish between successive print cycles. If it were to indicate a high level, the high level would only indicate that at least one print cycle had occurred but would not provide any count of print cycles. The sensor may be thought of as a D-type flip-flop which is set at 10′, reset by 18′, and providing an output at 17′. The block 16′ is comparable to the memory element 16 with its hysteresis which gives rise to bistability.

Those skilled in the art will readily appreciate that numerous variations could be devised to embody the invention without deviating from it. For example, instead of a using a magnet and a magnetic memory element, one could use a mechanical latch that is triggered by rotor movement through angle 91. The latch would be coupled to a switch. Triggering of the mechanical latch would give rise to a switch signal like that of sensor 17. The mechanical latch would be made so as to be resettable, as by energizing a solenoid to move the mechanical latch back to its reset position. Generally, one skilled in the art could employ any bistable device that is set by movement of the rotor past a predetermined angle, and that is capable of being reset by an electrical signal.

It will also be appreciated that while the sensor is depicted herein as coupled directly with the rotor, it would be possible to couple the sensor in any of a range of indirect means, including coupling to any indicator of rotor movement. Other means that are thought inferior to the disclosed embodiment but nonetheless within the scope of the invention would include: coupling the sensor to rollers elsewhere in the envelope feed path; coupling the sensor to movement sensing means elsewhere in the feed path; and coupling the sensor to mechanical elements that are in turn coupled to the rotor.

The software of the rotor sensing system, stored in memory 73 shown in FIG. 10, will now be discussed.

Figure 6:
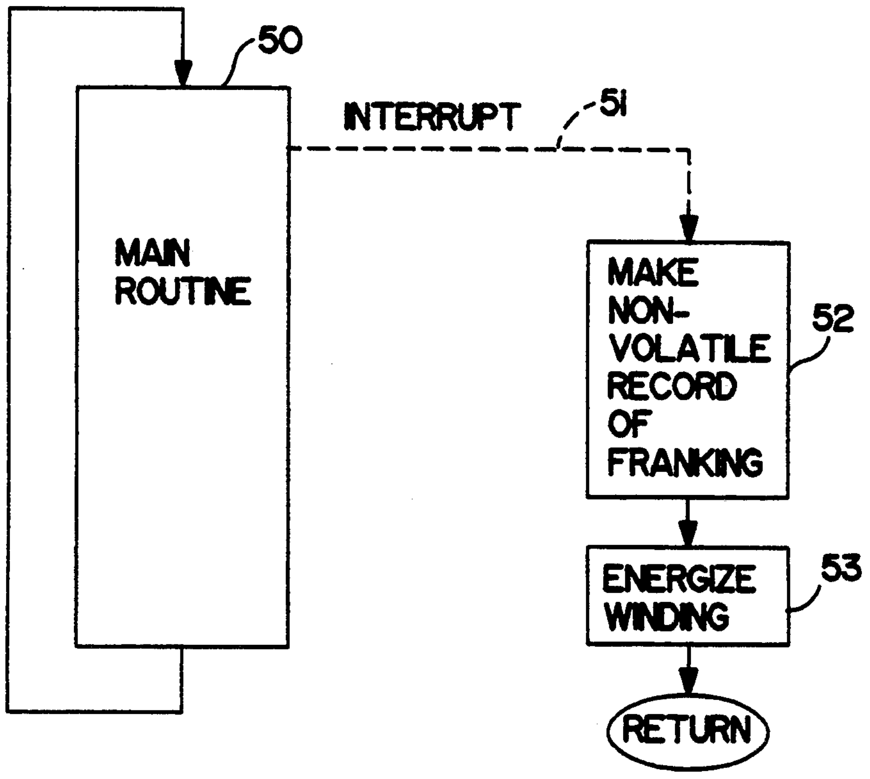
FIGS. 6–9 are flowcharts showing various software provisions relating to the MME sensor.

FIG. 6 shows in block diagram form the main routine that is being executed most of the time when the meter is powered. As will be appreciated, the main routine repeats itself over and over again. Loss of repetition of the main routine is preferably detected and remedied by a watchdog circuit, not shown. Dashed line 51 portrays the shift in program flow that occurs if an interrupt is received at the processor 70 via line 76 from sensor 17. At 52 a nonvolatile record is made of the occurrence of the franking cycle. At 53 the processor energizes the winding 18, after which execution returns to the main routine 50 where it was interrupted.

Those skilled in the art will appreciate the normal and standard steps taken in the interrupt service routine of blocks 52 and 53. The first instruction of the routine is preferably disabling interrupts, followed by a masking of selected interrupts including the sensor-17 interrupt, followed by a re-enabling of interrupts. After the winding 18 has been energized, the sensor-17 signal is t0 tested, and barring the unexpected persistence of the sensor-17 signal, the sensor-17 interrupt is again unmasked and/or re-enabled.

Those skilled in the art will also appreciate that nothing in the rotor sensing system requires that resetting of the MME 16 by energizing winding 18 take place prior to the end of the print cycle. While the resetting is so portrayed in FIG. 4 and in FIG. 6, the system could just as well permit these tasks to wait until after the rotor has again returned to its home position without deviating in any way from the system concept.

In contrast to the normal, fully-powered circumstance of FIG. 6, routines will now be described to provide for the possibility that at the time of power-up, a print cycle may have taken place. At FIG. 7, the meter's software with respect to powerup is shown in one embodiment. At 55, interrupts are disabled. At 54, the meter is initialized, preferably including a test of the print wheels of rotor 77 to determine what positions they were in. The print wheel positions are noted for later reference, and are compared with what the processor had noted the print wheel positions to be prior to the last previous loss of power. At 57, the processor 70 polls the condition of the MME sensor 17 via line 76 (FIG. 10) and I/O port 74. At 58, a branch is made in the normal case, namely if no unaccounted-for print cycle has been detected, namely a jump to block 56. If, however, an unaccounted-for print cycle has been detected (as indicated by MME sensor 17), then blocks 52 and 53 are executed analogously to like-numbered blocks of FIG. 6. (Those skilled in the art will also appreciate that it may be helpful for troubleshooting or maintenance to make a nonvolatile record of the occurrence of power-up together with the sensor 17 having been set.) Block 56 re-enables interrupts, and control passes to the main routine of FIG. 6.

Figure 7:
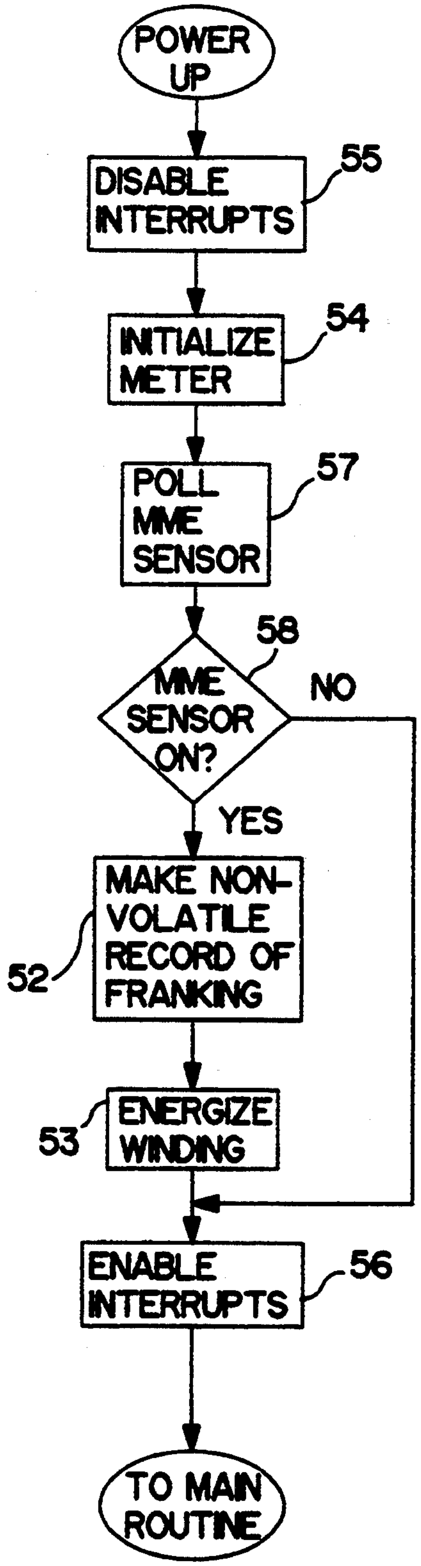
Figure 8:
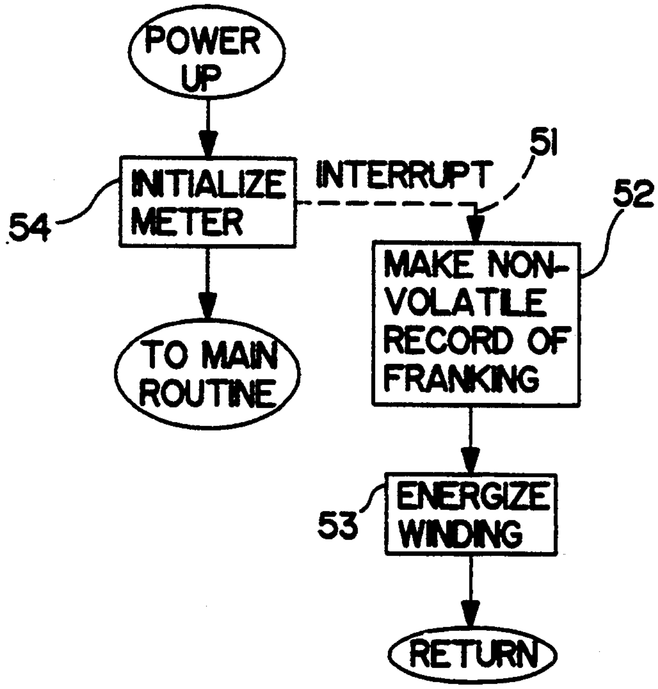

FIG. 8 shows the software configuration if a different approach is taken than that of FIG. 7. In FIG. 8, no attempt is made to disable interrupts. Instead, the signal from sensor 17, which is present from the moment of power-up, causes an interrupt to occur quite early on in processor execution of the initialization routine 54. The interrupt branches via 51 and the interrupt servicing routine of blocks 52 and 53 takes place much as in FIG.

6. Eventually control returns to the initialization routine 54 and eventually passes to the main routine of FIG. 6.

Figure 9:
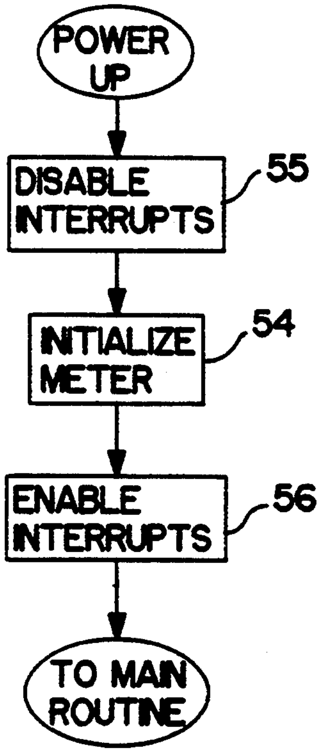

FIG. 9 shows yet another software configuration if a different approach is taken than that of FIGS. 7 and 8. In box 55 interrupts are disabled, and in box 54 the meter is initialized. In box 56 interrupts are re-enabled and control may pass to the main routine of FIG. 6. But if the signal from sensor 17, which may happen to be present from the moment of power-up, is present, then this causes an interrupt to occur right away after block 56, essentially at the start of the main routine of FIG. 6. There, the interrupt branches via 51 and the interrupt servicing routine of blocks 52 and 53 takes place. Eventually control returns to the main routine of FIG. 6.

Figure 11:
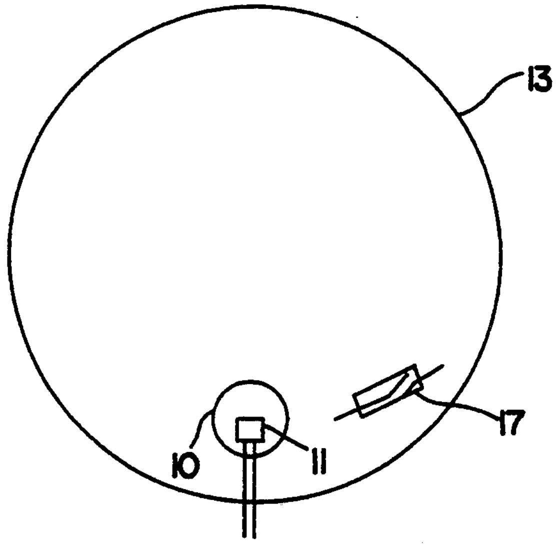
FIG. 11 is a diagrammatic plan view of a reed-switch embodiment of the invention.

In an alternative embodiment of the invention, a reed switch is employed to sense movement of the rotor past a particular angular position. A flip-flop provides a bistable means backed up by a lithium cell, and the output of the flip-flop provides a datum for the processor. FIG. 11 shows the switch arrangement relative to the rotor 13, with magnet 10, Hall-effect switch 11, and reed switch 17, all mounted to a printed circuit board, omitted for clarity in FIG. 11. The elements of FIG. 11 correspond to those of FIG. 1 for the embodiment previously discussed.

Figure 12:
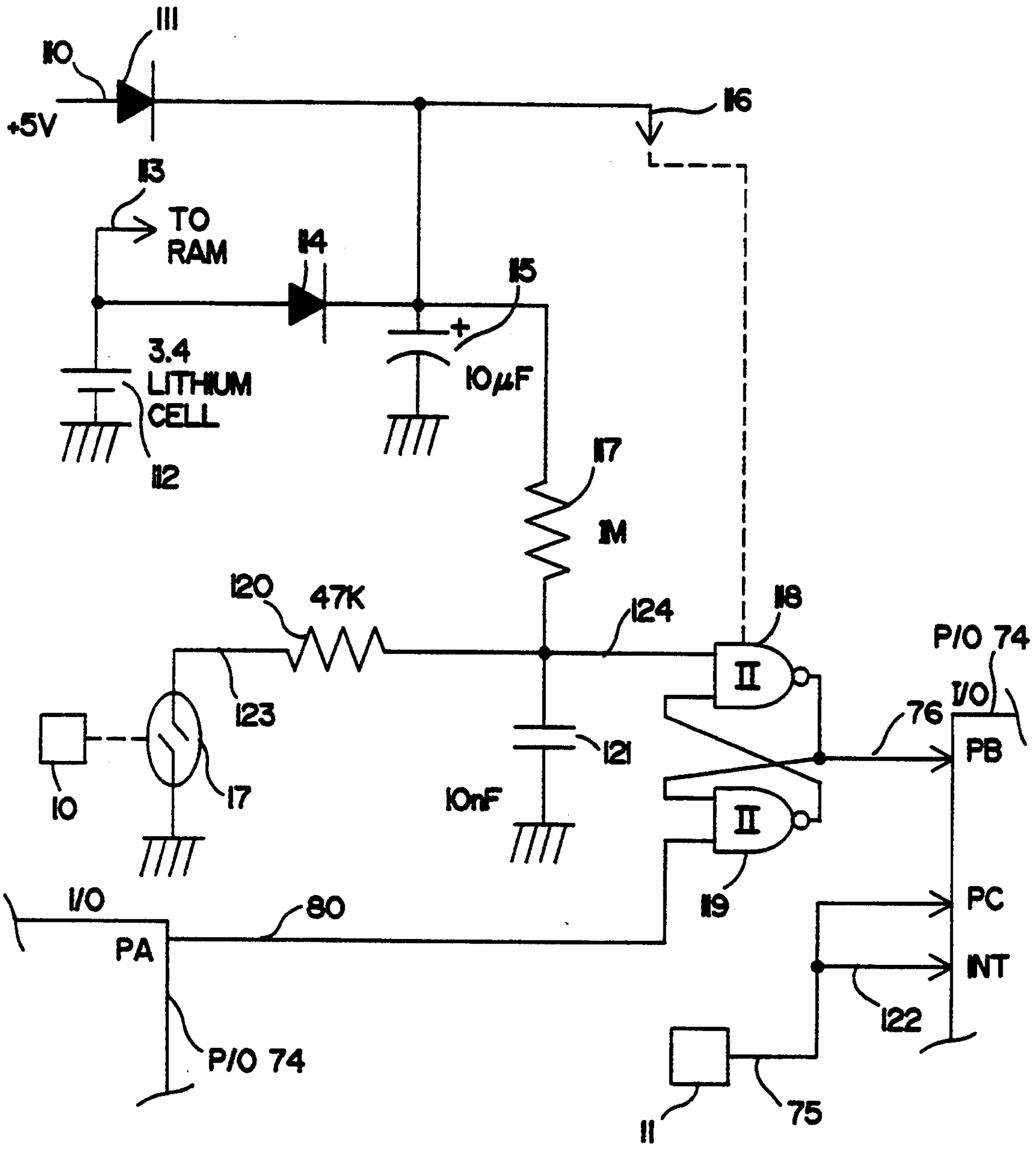
FIG. 12 is a schematic diagram of the reed-switch embodiment of FIG. 11.

FIG. 12 is a schematic diagram for the alternative embodiment. During normal operation the circuit is powered by the same +5 V source 110 that powers the rest of the meter. Lithium cell 112, preferably a 3.4 V cell, can also power the circuit reliably; isolation is provided by diodes 111, 114 and the power is smoothed by electrolytic capacitor 115. Optionally lithium cell 112 may also provide data backup for RAM, not shown in FIG. 12, via line 113.

Capacitor 121, preferably a highly stable capacitor, is charged through resistor 117. If magnet 10 nears reed switch 17, capacitor 121 is discharged through resistor 120. This defines high and low outputs on line 124, which serves as a setting input to an RS flip-flop composed of nand gates 118, 119. Nand gates 118, 199 are powered by line 116. As a consequence, the state of the flip-flop is preserved despite any changes in the level of the +5 V power supply at 110. The flip-flop, which is of course a bistable device, receives a reset input via line 80 from an output of the I/O port 74, part of which seen at the lower left of FIG. 12. The output of the flip-flop is provided via line 76 to an input of the I/O port 74, another part of which is seen at the lower right of FIG. 12. Hall-effect sensor 11 also provides an input via line 75 to an input of the I/O port 74.

It will be appreciated that in FIG. 12, the interrupt to the processor is not from the sensor 17 but rather from the sensor 11. This differs from the embodiment disclosed above, in which the interrupt comes from the sensor 17. Those skilled in the art will appreciate that either embodiment could, in principle, use either sensor to provide an interrupt to the processor without deviating in any way from the invention.

Figure 13:
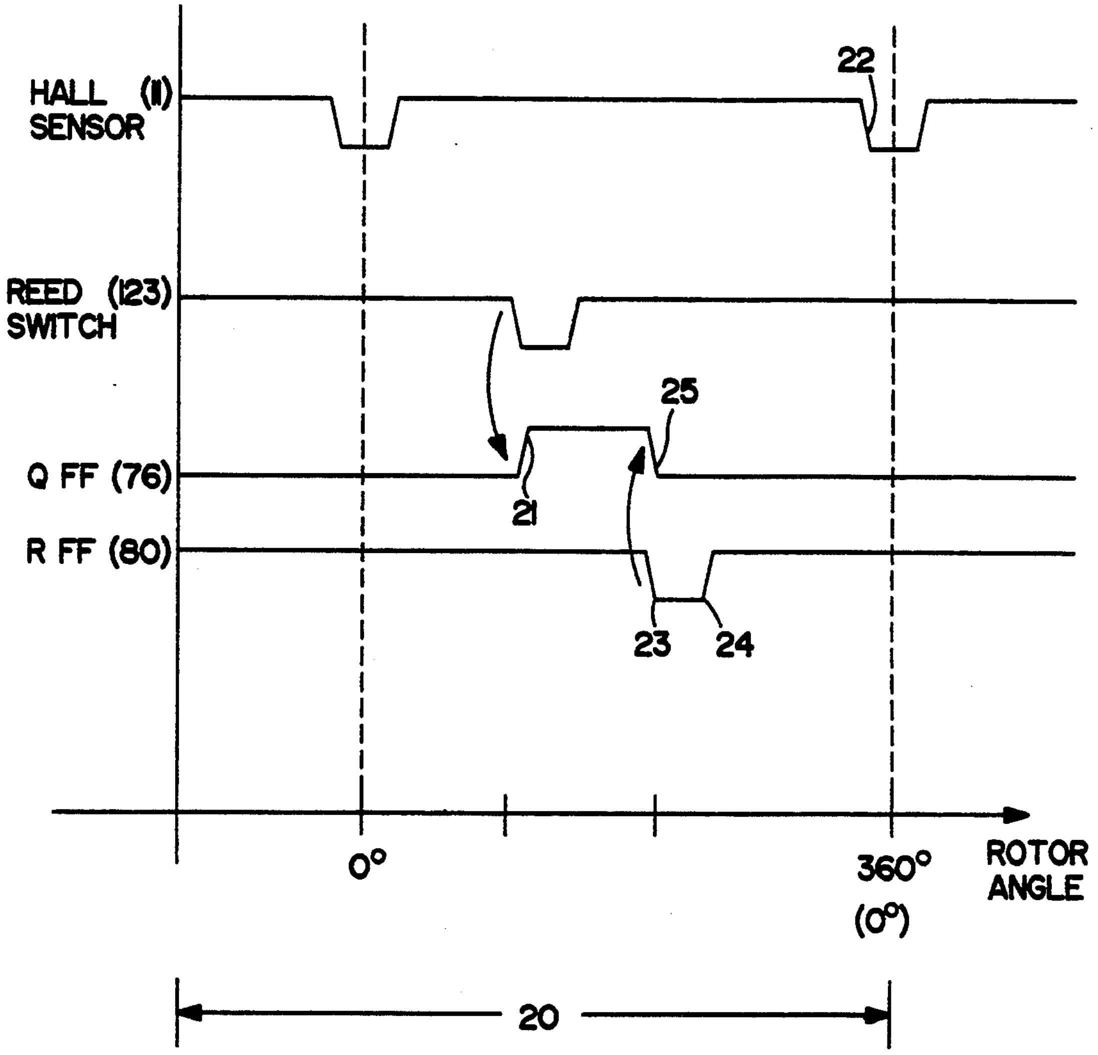
FIG. 13 is a timing diagram for the reed-switch embodiment of FIG. 11.

FIG. 13 shows a timing diagram for signals occurring during rotor rotation in the alternative embodiment. The diagram corresponds in many ways to the timing diagram of FIG. 4 for the first embodiment. The top line shows the output of sensor 11, which is high when the rotor begins in a home position, and is again high when the rotor has returned to a home position at 22. The duration of one complete print cycle is thus seen to correspond to interval 20.

The next line shows the output of the sensor 17. At 21, the output falls, which means the rotor has moved so as to bring magnet 10 nearby to reed switch 17. Then, at time 23, processor 70 generates the reset signal via line 80 (see FIG. 12). The interval between 21 and 23 is mostly a result of the latency time of the interrupt-handling routine of the processor. The pulse is held until time 24, which may be a fixed interval or may be an interval determined by the downgoing transition 25 as detected by the processor.

If the system has the interrupt coming from the sensor 11 instead of the sensor 17, this changes in particular detail some of the software-driven activities of FIGS. 6–9. In FIG. 6, the arrival of the interrupt at 51 prompts making a nonvolatile record that it was suspected a franking had occurred (to provide for the case where power fails while the rotor continues to move). If, while the software is in block 52, the second switch 17 is triggered, then the reset pulse of line 80 is generated in block 53, and the nonvolatile record is updated to show the normal and tidy progress of the franking activity.

If the software arrangement of FIG. 7 is considered, it will be seen that the polling of the flip-flop contents (block 57) suffices to determine that the sensor 17 must have been triggered at some time prior to the present instance of power having been applied. Thus it is assumed that franking took place, and the reset pulse of line 80 is generated in block 53.

In the case now being discussed where the output of the bistable device does not generate an interrupt, then the software arrangement of FIGS. 8 and 9 is inapplicable.

Those skilled in the art will appreciate that while the circuit is shown using a reed switch and a Hall-effect switch, other sensing technologies could be used without departing from the invention. Likewise, numerous other bistable storage technologies could be employed other than the particular nand-gate flip-flop shown in FIG. 12.

Those skilled in the art will readily appreciate that while the steps described above are described as occurring in software that is executed by a processor, the steps could just as well be accomplished by random logic circuitry dedicated for that purpose.

We claim:

1. A rotor movement sensing system for use in a postage meter having a rotor for printing postage by cyclic rotation thereof, and having a register relating to postage printed by the rotor, the rotor position between postage printing cycles defining a home position, the sensing system comprising:

bistable means having an output, a setting input and a resetting input, the setting input operatively coupled to the rotor so as to set the bistable means upon rotation of the rotor by a first predetermined angle past the home position, and means responsive to the output for changing the register contents and for actuating the resetting input.

2. The rotor movement sensing system of claim 1 wherein:

the bistable means comprises a magnetic memory element, and a Hall-effect sensor and a solenoid adjacent the magnetic memory element, the setting input comprises a permanent magnet operatively coupled with the rotor, the output comprises the output of the Hall-effect sensor, and the resetting input comprises leads of the solenoid.

3. The rotor movement sensing system of claim 1 wherein:
the bistable means comprises a flip-flop with a reliable source of power,
the setting input comprises a permanent magnet operatively coupled with the rotor,
the output comprises the output of the flip-flop, and
the resetting input comprises a reset input of the flip-flop.

4. The rotor movement sensing system of claim 1 wherein:
the means responsive to the output comprises a microprocessor executing a stored program.

5. The rotor movement sensing system of claim 1 further comprising ratchet means operatively coupled with the rotor whereby the rotor cannot move oppositely to the direction for printing postage by more than a second predetermined angle, and wherein the first predetermined angle is selected to be greater than the second predetermined angle.

6. The rotor movement sensing system of claim 2 wherein:
the means responsive to the output comprises a microprocessor executing a stored program.

7. The rotor movement sensing system of claim 2 further comprising ratchet means operatively coupled with the rotor whereby the rotor cannot move oppositely to the direction for printing postage by more than a second predetermined angle, and wherein the first predetermined angle is selected to be greater than the second predetermined angle.

8. The rotor movement sensing system of claim 6 further comprising ratchet means operatively coupled with the rotor whereby the rotor cannot move oppositely to the direction for printing postage by more than a second predetermined angle, and wherein the first predetermined angle is selected to be greater than the second predetermined angle.

9. The rotor movement sensing system of claim 4 wherein the output further comprises an interrupt to the microprocessor, and wherein the stored program further comprises an interrupt routine.

10. The rotor movement sensing system of claim 6 wherein the output further comprises an interrupt to the microprocessor, and wherein the stored program further comprises an interrupt routine.

11. The rotor movement sensing system of claim 8 wherein the output further comprises an interrupt to the microprocessor, and wherein the stored program further comprises an interrupt routine.

12. A rotor movement sensing system for use in a postage meter having a rotor for printing postage by cyclic rotation thereof, and having a register relating to postage printed by the rotor, the rotor position between postage printing cycles defining a home position, the sensing system comprising:
bistable means having an output, a setting input and a resetting input, the setting input operatively coupled to the rotor so as to set the bistable means upon rotation of the rotor by a first predetermined angle past the home position, and
means responsive to application of power to the meter and further responsive to the output for changing the register contents, for actuating the resetting input, and for making record of the occurrence of the output being present upon the application of power.

13. The rotor movement sensing system of claim 12 wherein:
the bistable means comprises a magnetic memory element, and a Hall-effect sensor and a solenoid adjacent the magnetic memory element,
the setting input comprises a permanent magnet operatively coupled with the rotor,
the output comprises the output of the Hall-effect sensor, and
the resetting input comprises leads of the solenoid.

14. The rotor movement sensing system of claim 12 wherein:
the bistable means comprises a flip-flop with a reliable source of power,
the setting input comprises a permanent magnet operatively coupled with the rotor,
the output comprises the output of the flip-flop, and
the resetting input comprises a reset input of the flip-flop.

15. The rotor movement sensing system of claim 12 wherein:
the means responsive to application of power and further responsive to the output comprises a microprocessor executing a stored program.

16. The rotor movement sensing system of claim 12 further comprising ratchet means operatively coupled with the rotor whereby the rotor cannot move oppositely to the direction for printing postage by more than a second predetermined angle, and wherein the first predetermined angle is selected to be greater than the second predetermined angle.

17. The rotor movement sensing system of claim 13 wherein:
the means responsive to application of power and further responsive to the output comprises a microprocessor executing a stored program.

18. The rotor movement sensing system of claim 13 further comprising ratchet means operatively coupled with the rotor whereby the rotor cannot move oppositely to the direction for printing postage by more than a second predetermined angle, and wherein the first predetermined angle is selected to be greater than the second predetermined angle.

19. The rotor movement sensing system of claim 17 further comprising ratchet means operatively coupled with the rotor whereby the rotor cannot move oppositely to the direction for printing postage by more than a second predetermined angle, and wherein the first predetermined angle is selected to be greater than the second predetermined angle.

20. The rotor movement sensing system of claim 15 wherein the output further comprises an interrupt to the microprocessor, and wherein the stored program further comprises an interrupt routine.

21. The rotor movement sensing system of claim 17 wherein the output further comprises an interrupt to the microprocessor, and wherein the stored program further comprises an interrupt routine.

22. The rotor movement sensing system of claim 19 wherein the output further comprises an interrupt to the microprocessor, and wherein the stored program further comprises an interrupt routine.

23. A method for use with a rotor movement sensing system in a postage meter having a rotor for printing postage by cyclic rotation thereof, and having a register relating to postage printed by the rotor, the rotor position between postage printing cycles defining a home position, the sensing system comprising bistable means having an output, a setting input and a resetting input, the setting input operatively coupled to the rotor so as to set the bistable means upon rotation of the rotor by a first predetermined angle past the home position, the method comprising the steps, performed in response to the output, of:

changing the register contents, and actuating the resetting input.

24. The method of claim 23 wherein the bistable means comprises a magnetic memory element, and a Hall-effect sensor and a solenoid adjacent the magnetic memory element, the setting input comprises a permanent magnet operatively coupled with the rotor, and the output comprises the output of the Hall-effect sensor, the step of actuating the resetting input further comprising the step of applying current to the solenoid.

25. The method of claim 23 wherein the bistable means comprises a flip-flop with a reliable source of power, the setting input comprises a permanent magnet operatively coupled with the rotor, and the output comprises the output of the flip-flop, the step of actuating the resetting input further comprising the step of applying voltage to a reset input of the flip-flop.

26. The method of claim 23 wherein the meter further comprises a processor, and the output further comprises an interrupt to the processor, and wherein the method further comprises the step of responding to the interrupt for executing an interrupt routine.

27. The method of claim 24 wherein the meter further comprises a processor, and the output further comprises an interrupt to the processor, and wherein the method further comprises the step of responding to the interrupt for executing an interrupt routine.

28. A method for use with a rotor movement sensing system in a postage meter having a rotor for printing postage by cyclic rotation thereof, and having a register relating to postage printed by the rotor, the rotor position between postage printing cycles defining a home position, the sensing system comprising bistable means having an output, a setting input and a resetting input, the setting input operatively coupled to the rotor so as to set the bistable means upon rotation of the rotor by a first predetermined angle past the home position, the method comprising the steps of:

applying power to the meter, and determining the state of the output and, if the output is present, changing the register contents, and actuating the resetting input.

29. The method of claim 28 wherein the determining step further comprises the step, if the output is present, of making record of the occurrence of the output being present upon the application of power.

30. The method of claim 28 wherein the bistable means comprises a magnetic memory element, and a Hall-effect sensor and a solenoid adjacent the magnetic memory element, the setting input comprises a permanent magnet operatively coupled with the rotor, and the output comprises the output of the Hall-effect sensor, and wherein the actuating step comprises applying current to the solenoid.

31. The method of claim 28 wherein the bistable means comprises a flip-flop with a reliable source of power, the setting input comprises a permanent magnet operatively coupled with the rotor, and the output comprises the output of the flip-flop, and wherein the actuating step comprises applying voltage to a reset input of the flip-flop.

32. The method of claim 30 wherein the determining step further comprises the step, if the output is present, of making record of the occurrence of the output being present upon the application of power.

* * * * *